US006525935B2

(12) United States Patent
Casebolt

(10) Patent No.: US 6,525,935 B2
(45) Date of Patent: Feb. 25, 2003

(54) LOW PROFILE HIGHLY ACCESSIBLE COMPUTER ENCLOSURE WITH PLENUM FOR COOLING HIGH POWER PROCESSORS

(75) Inventor: Matthew P. Casebolt, Fremont, CA (US)

(73) Assignee: Appro International, Inc., Milpitas, CA (US)

( * ) Notice: Subject to any disclaimer, the term of this patent is extended or adjusted under 35 U.S.C. 154(b) by 0 days.

(21) Appl. No.: 09/804,559

(22) Filed: Mar. 12, 2001

(65) Prior Publication Data

US 2002/0126449 A1 Sep. 12, 2002

(51) Int. Cl.[7] .................................................. H05K 5/00
(52) U.S. Cl. ........................ 361/687; 361/695; 454/184; 312/236
(58) Field of Search ................................. 361/687, 690, 361/691, 692, 695, 697, 707–709; 454/184, 353; 165/80.3, 121–126; 312/236

(56) References Cited

U.S. PATENT DOCUMENTS 5,388,032 A * 2/1995 Gill et al. .................... 364/146
5,430,607 A * 7/1995 Smith .......................... 361/683
5,546,272 A * 8/1996 Moss et al. .................. 361/687
5,572,403 A * 11/1996 Mills ........................... 361/695
6,129,429 A * 10/2000 Hart et al. ................ 312/223.2

* cited by examiner

Primary Examiner—Darren Schuberg
Assistant Examiner—Hung Van Duong
(74) Attorney, Agent, or Firm—Perkins Coie LLP

(57) ABSTRACT

A low profile highly accessible computer enclosure with a processor plenum for cooling high power processors is disclosed. The enclosure includes one or more air movement devices that discharge air into a plenum. The plenum channels the air to a location proximate to one or more high power processors where it is discharged over the processors. The velocity of the air is sufficient to achieve a convection coefficient that will cool the high power processors. The enclosure can also be slidably mounted in a computer rack and include a multi-section top cover. While the computer is operating, an operator can access, inspect, service, repair, or replace components within server by sliding the server out of the front and/or rear of the computer rack and then removing one or more of the cover sections.

39 Claims, 6 Drawing Sheets

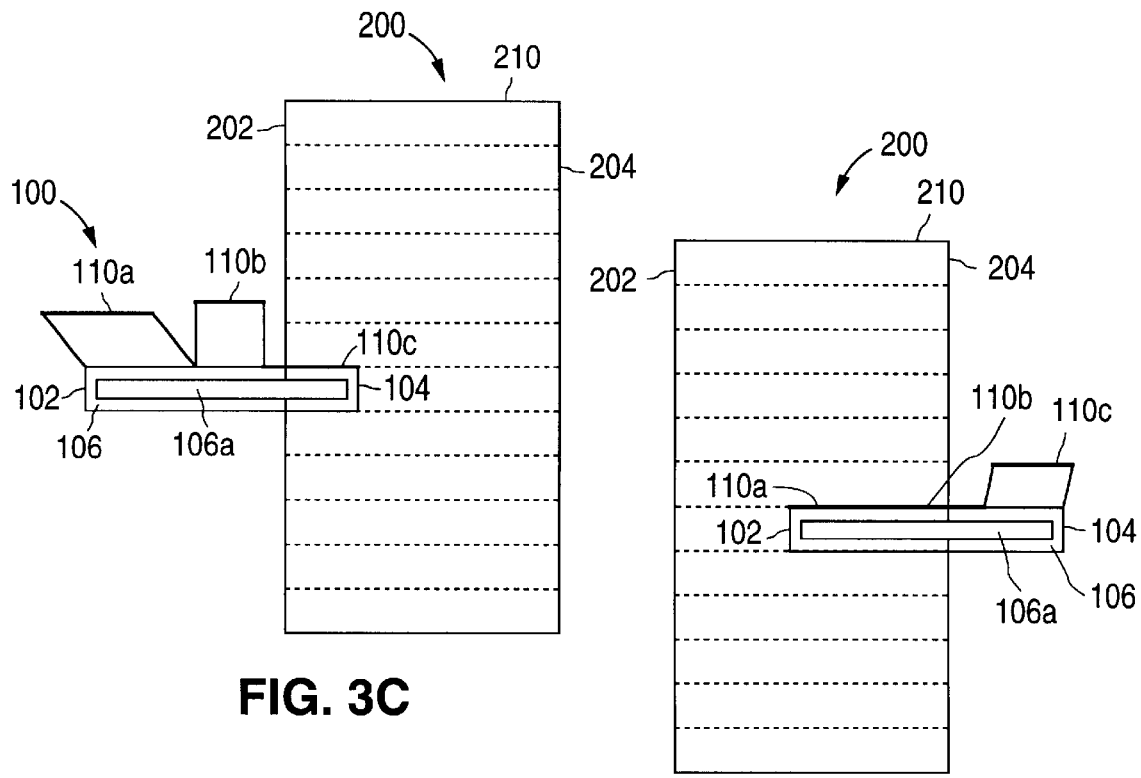
FIG. 3C
FIG. 3D
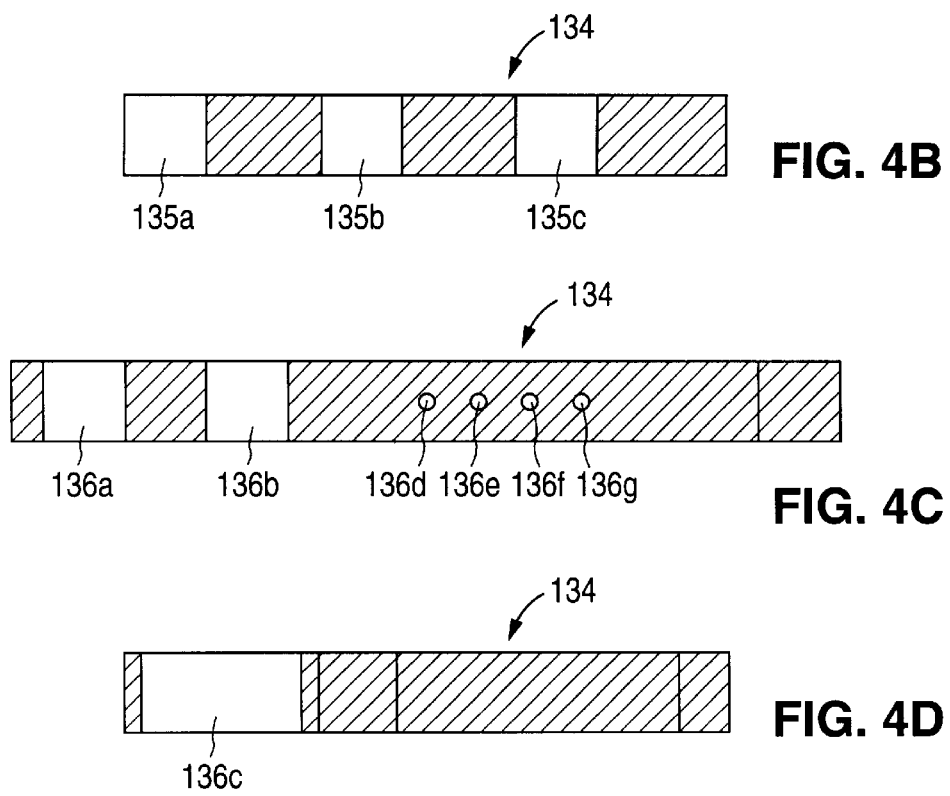
FIG. 4B
FIG. 4C
FIG. 4D

LOW PROFILE HIGHLY ACCESSIBLE COMPUTER ENCLOSURE WITH PLENUM FOR COOLING HIGH POWER PROCESSORS

BACKGROUND

1. Field of the Invention

This invention relates to computer systems, and more specifically, to computer enclosures and the design and layout of components within computer enclosures.

2. Discussion of the Related Art

As computing applications grow, there has been an associated increase in the number of large scale computer systems. Large scale computer systems typically include multiple server computers or servers. Typically, a server is a computer provided in an enclosure that contains various components such as processors, hard drives, CD-ROMs, DVDs, tape backup systems, PCI cards, fans or blowers, power supplies. A server in a large scale computer system is typically connected to a computer network and is mounted on a server rack or cabinet in a dedicated server location, often with temperature, humidity, and particle controls. On such a rack, the server can be stored with high space efficiency, while allowing easy access to its front and rear panels.

Rack-mounted servers are typically provided in unit or "U" sizes. A typical 1 unit ("1U") server measures 1.75" high, 19.00" wide, and 24.00" deep. An advantage of a 1U server is that its low profile allows a larger number of servers to be mounted on a rack. For example, forty-two (42) 1U servers can be mounted in a single 7-foot rack. As a result, the computing power associated with a given rack can be substantial.

One disadvantage associated with a conventional low profile server is that cooling of the processors located inside the server is difficult. As mentioned above, a 1U server is only 1.75" high. This limited height makes it difficult to circulate air throughout the enclosure and cool the processors, as such a height prevents heat sinks that include a fan or "fan sinks" to be mounted to the processors. Furthermore, newer generation processors dissipate greater amounts of power and thus generate greater amounts of heat. As a result, these high power processors overheat and operate improperly or fail when implemented in low profile servers having conventional cooling systems.

Another disadvantage associated with conventional low profile servers is that components located within the chassis, and in particular components located near the center of the chassis, cannot be accessed, inspected, serviced, repaired, or replaced while the servers are mounted in a server rack and connected to the computer network. To access such components for servicing, an operator must disconnect the cables connected to the server, remove the server from the rack, and then remove the top panel of the server. This process is undesirable since the server must be taken off-line (i.e., disconnected from the computer network) while the operator is replacing or repairing the components within the server.

Accordingly, a computer system that overcomes the disadvantages and limitations mentioned above is needed.

SUMMARY

In one embodiment of the present invention, a computer system is provided which includes a chassis, a processor disposed in the chassis, an air movement device disposed in the chassis, the air movement device having an inlet for receiving air and an outlet for expelling air, and a plenum disposed in the chassis, the plenum having an inlet for receiving air from the outlet of the air movement device and an outlet for expelling the air proximate to the processor.

In another embodiment of the present invention, a computer system is provided which includes a chassis, a processor disposed in the chassis, air movement means disposed in the chassis for drawing air into the chassis and expelling air, and air channeling means disposed in the chassis for channeling the air expelled from the air movement means to a location proximate to the processor and directing the air over the processor.

In another embodiment of the present invention, a method for cooling a processor disposed in a chassis is disclosed. The method includes drawing air through an inlet of the chassis into an air movement device, expelling the air from the air movement device into a plenum, redirecting the air to a location proximate to the processor via the plenum, and discharging the air from an outlet of the plenum over the processor.

In another embodiment of the present invention, a computer system is disclosed which includes a chassis, slides for mounting the chassis in a computer rack, the slides being disposed on a first side and a second side of the chassis, and a cover having at least two sections. In this computer system, the chassis can be partially removed from the computer rack by partially sliding the chassis out of the front or the rear of the rack thereby allowing an operator to access computer components located beneath one of the sections.

In another embodiment of the present invention a computer system is disclosed which includes a chassis, mounting means disposed on a first side and a second side of the chassis, the mounting means for mounting the chassis in a computer rack, and cover means disposed over a top portion of the chassis having at least two sections, wherein the cover means allows an operator to partially remove the chassis from the front or rear of the computer rack, remove a section of the cover means, and access one or more computer components located below the removed section of the cover means.

Other embodiments, aspects, and advantages of the present invention will become apparent from the following descriptions, the accompanying drawings, and the accompanying claims.

BRIEF DESCRIPTION OF THE FIGURES

For a more complete understanding of the present invention and for further features and advantages, reference is now made to the following description taken in conjunction with the accompanying drawings, in which:

FIG. 3C is a side view of the server rack and the server of FIG. 3B with the server partially removed from the front side of server rack, according to some embodiments of the present invention.

FIG. 3D is a side view of the server rack and the server of FIG. 3B with the server partially removed from the rear side of a server rack, according to some embodiments of the present invention.

FIGS. 4B, 4C, and 4D are a front view, a right side view, and a rear view of the plenum of FIG. 4A, according to some embodiments of the present invention.

DETAILED DESCRIPTION

The preferred embodiments of the present invention and their advantages are best understood by referring to FIGS. 1 through 6 of the drawings. Like numerals are used for like and corresponding parts of the various drawings.

Figure 1:
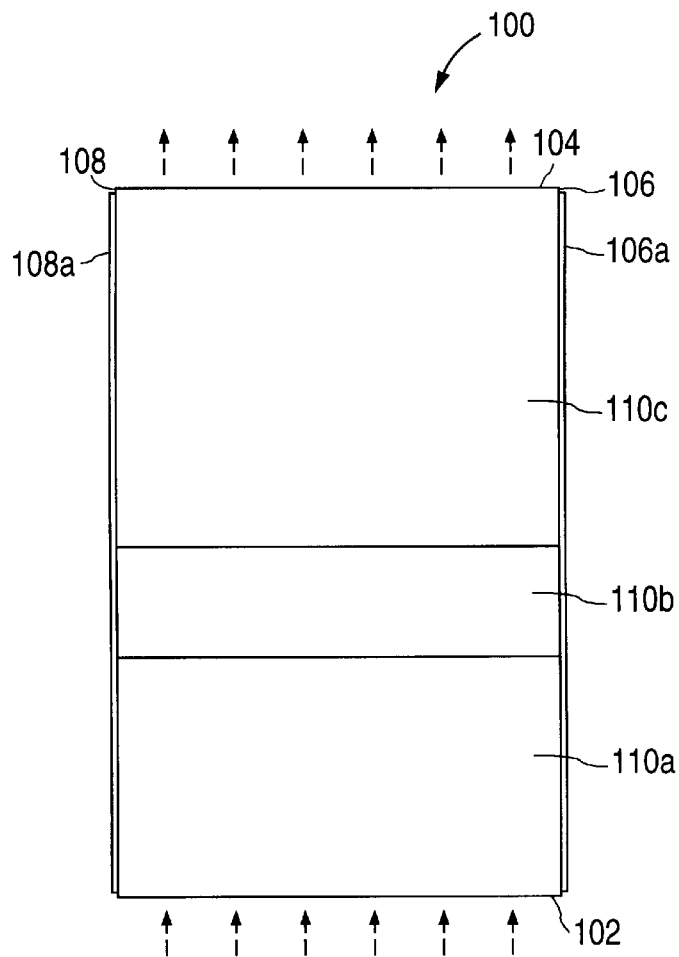
FIG. 1 is a top view of a server, according to some embodiments of the present invention.

FIG. 1 is a top view of an exemplary server 100, according to some embodiments of the present invention. Server 100 includes a front side 102, a rear side 104, a right side 106, and a left side 108. Right side 106 includes a right rack slide 106a and left side 108 includes a left rack slide 108a. Rack slides 106a and 108a are structures that allow server 50 to be slidably mounted in a server rack. Rack slides 106a and 108a can be mounted onto right side 106 and left side 108, respectively, or rack slides 106a and 108b can an integral part of right side 106 and left side 108. Server 100 also includes a cover 110 having a removable front section 110a, a removable middle section 110b, and a removable rear section 110c. During operation, air is drawn into front side 102 of server 100 by one or more air movement devices (not shown) located within server 100. The air is then propelled by the air movement devices, and then the air exits rear side 104 of server 100. The direction of air flow is indicated by dashed arrows in FIGS. 1–6.

Figure 2A:
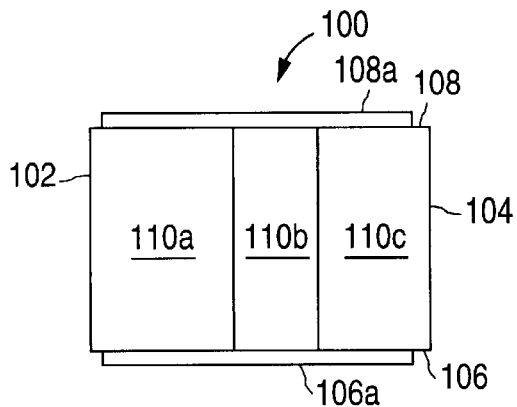
FIGS. 2A and 2B are a top view of a server and a side view of a server, respectively, according to some embodiments of the present invention.
Figure 2B:
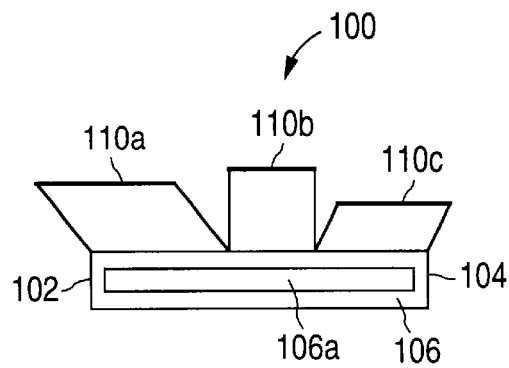

FIGS. 2A and 2B are a top view and a side view of server 100 of FIG. 1, respectively, according to some embodiments of the present invention. Cover 110 includes removable front section 110a, removable middle section 110b, and removable rear section 110c. Sections 110a, 110b, and 110c can be independently mounted to and removed from server 100. For example, front section 110a and rear section can be mounted to server 110c while middle section 110b is removed. This allows an operator to access, inspect, service, repair, or replace components located beneath sections 110a, 110b, or 110c without having to remove the entire cover from server 100. This is advantageous since it prevents an operator from inadvertently disturbing and possibly damaging components in sections of server 100 that do not need to be accessed, inspected, serviced, repaired, or replaced at that time. This is also advantageous since components can be accessed within server 100 while server 100 is mounted in a rack and connected to a computer network (described in detail below). Thus, server 100 does not necessarily have to be taken off line or out of operation when components need to be replaced (e.g., fans) or when components need to be added.

Figure 2C:
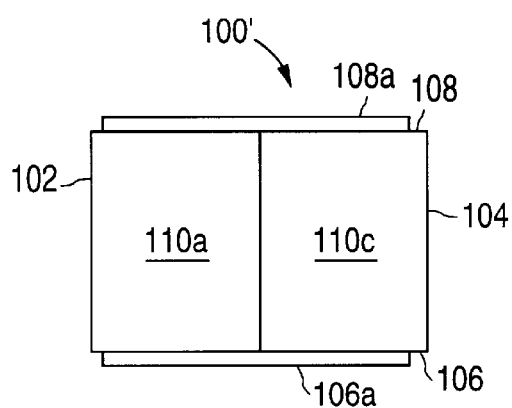
FIGS. 2C and 2D are a top view of a server and a side view of a server, respectively, according to some embodiments of the present invention.
Figure 2D:
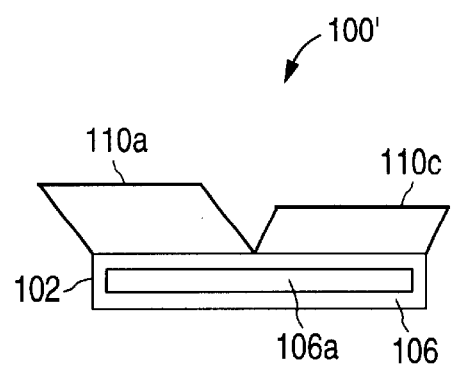

FIGS. 2C and 2D are a top view of a server 100' and a side view of a server 100', respectively, according to some embodiments of the present invention. Server 100' of FIGS. 2C and 2D is similar to server 100 of FIGS. 2A and 2B except that cover 110 only includes two (rather than three) removable sections, removable front section 110a and removable rear section 110c.

Figure 3A:
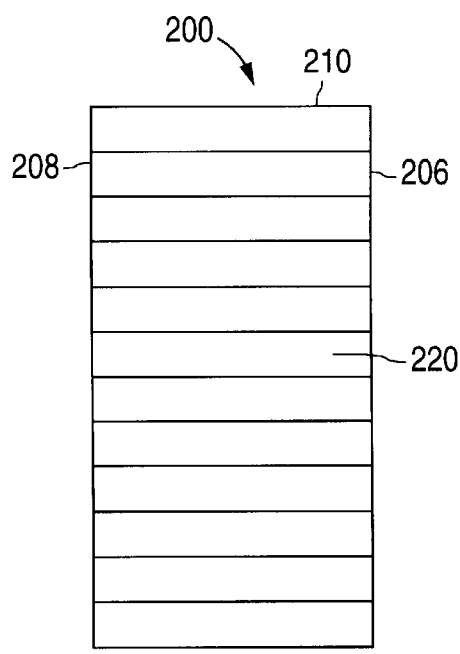
FIG. 3A is a front view of a server rack.

FIG. 3A is a front view of a server rack 200. Server rack 200 includes a top side 210, a right side 206, a left side 208, and a plurality of server bays 220. An individual server can be installed in each server bay 220.

Figure 3B:
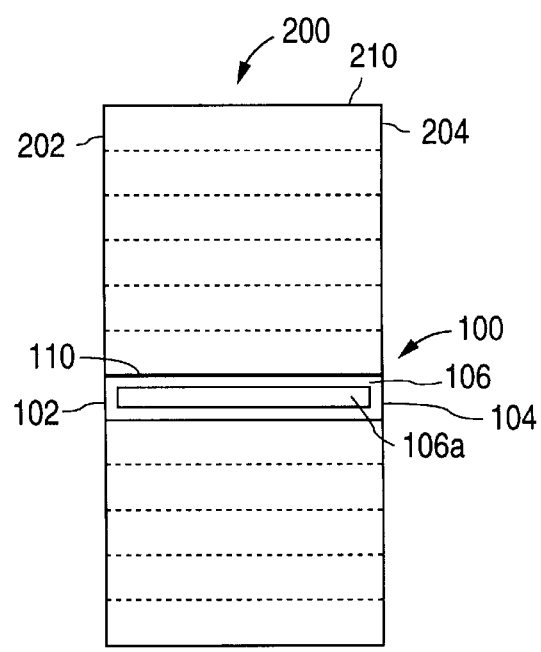
FIG. 3B is a side view of a server rack with a server installed in the server rack.

FIG. 3B is a right side view of server rack 200 of FIG. 3A with a server 100 installed. Server rack 200 includes a front side 202 and a rear side 204. An operator can install server 100 in server rack 200 by aligning rack slides 106a and 108a with corresponding hardware (not shown) in server bay 200 and sliding server 100 into server bay 200. When installed, front side 102 of server 100 is substantially flush with front side 202 of server rack 200 and back side 104 of server 100 is substantially flush with back side 204 of server rack 200. Although not shown, back side of server 200 is typically connected to cables (not shown) such as power cables and networking cables when installed in server rack 200.

FIG. 3C is a side view of server rack 200 and server 100 of FIG. 3B with server 100 partially removed from the front side 202 of server rack 200, according to some embodiments of the present invention. An operator can partially remove server 100 from front side 202 of server rack 200 by sliding server 100 out of server rack 200. Once partially removed, the operator can remove removable front section 110a and/or removable middle section 110b. The operator can then access, inspect, service, repair, and/or replace components within server 100 located beneath the removed section. For example, if an air movement device such as a blower or fan is located beneath removable middle section 110b, the operator can remove the air movement device that is functioning improperly or that has failed and replace it with a new one. It is important to note that the operator can perform this task without having to disconnect the cables (not shown) connected to rear side of server 100. Thus, in some instances, the operator can access, inspect, service, repair, or replace components within server 100, and in particular beneath front section 110a and middle section 110b of server 100, while server 100 continues to operate.

FIG. 3D is a side view of server rack 200 and server 100 of FIG. 3B with server 100 partially removed from the back side 204 of server rack 200, according to some embodiments of the present invention. An operator can partially remove server 100 from back side 204 of server rack 200 by sliding server 100 out of server rack 200. Once partially removed, the operator can remove removable rear section 110c. The operator can then access, inspect, service, repair, or replace components within server 100 located beneath rear section 110c. Although not shown, the operator can slide server 100 further out of server rack 200 and then access, inspect, service, repair, or replace components within server 100 located beneath middle section 110b. As explained above, the operator can perform these tasks without having to disconnect the cables connected to rear side of server 100, which is advantageous since server 100 does not need to be taken out of service to access, inspect, service, repair, or replace components within server 100.

Figure 4A:
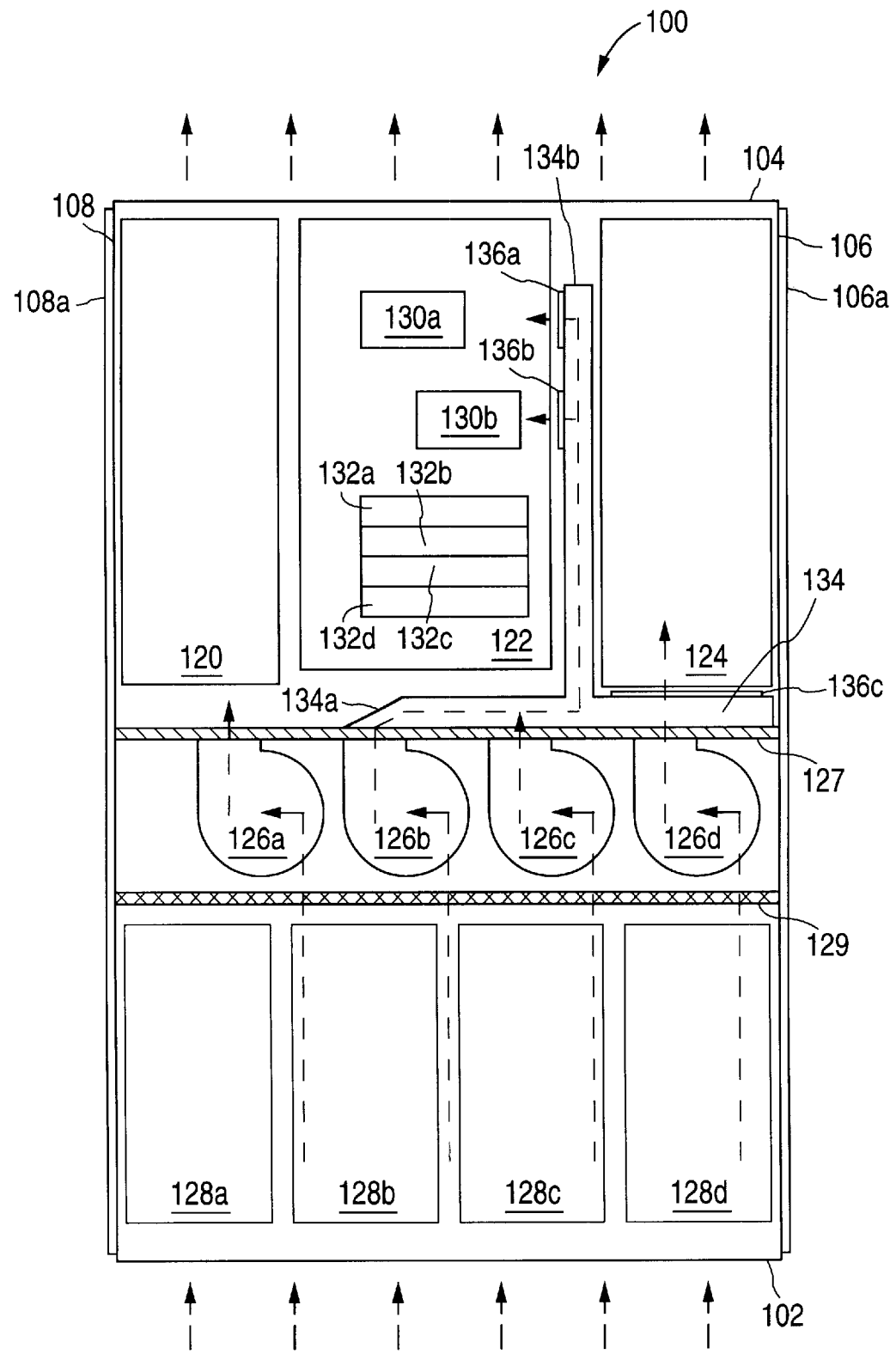
FIG. 4A is a top view of a server having a plenum with its cover removed, according to some embodiments of the present invention.

FIG. 4A is a top view of exemplary server 100 of FIG. 1 with cover sections 110a, 110b, and 110c removed, according to some embodiments of the present invention. Server 100 includes a PCI card 120, a motherboard 122, a power supply 124, centrifugal blowers 126 (separately labeled 126a, 126b, 126c, and 126d), and disk drives 128 (separately labeled 128a, 128b, 128c, and 128d). Blowers 126 are separated from PCI card 120, motherboard 122, and power supply 124 by a bulkhead 127. Bulkhead 127 provides an airtight or substantially airtight wall or barrier between blowers 126 and PCI card 120, motherboard 122, and power supply 124. Bulkhead 127 includes openings or holes (not shown) that correspond to the outlets of blowers 126a, 126b, 126c, and 126d. Disk drives 128 are connected to a backplane 129. Bulkhead 127 may also include a sealable opening or hole (not shown) that allows cables to run from disk drives 128 or backplane 129 to motherboard 122. Server 100 may also include additional components and/or not include all of the components shown in FIG. 4.

Motherboard 122 includes processors 130a and 130b and memory units 132 (separately labeled 132a, 132b, 132c, and 132d). Motherboard 122 also includes other components which have been omitted to improve clarity. Motherboard 122 can be a custom motherboard or a motherboard that conforms to an industry standard such as an ATX or an EATX motherboard. Processors 130a and 130b can be any type of processors including high power processors. As used herein, a high power processor is a processor that dissipates at least 30 watts of power. Processors 130a and 130b typically have heatsinks (not shown) mounted thereon. The heatsinks will typically be passive heatsinks, since fan sinks generally cannot fit in a low profile chassis.

Server 100 also includes a plenum 134. As shown, plenum 134 has an upside down "T" shape and has a front section 134a and a rear section 134b. Plenum 134 includes inlets (not shown) that receive air that is expelled by blowers 126b, 126c, and 126d, an outlet 136c for directing air toward power supply 124, and an outlets 136a and 136b for expelling air toward processors 130a and 130b, respectively. Plenum 134 can be made of any suitable material such as sheet metal or plastic.

FIGS. 4B, 4C, and 4D are a front view, a right side view, and a rear view of plenum 134 of FIG. 4A, according to some embodiments of the present invention. FIG. 4B shows three plenum inlets 135a, 135b, and 135c that receive air discharged by blowers 126b, 126c, and 126d, respectively. FIG. 4C shows plenum outlets 136a and 136b which are aligned with and discharge air over processors 130a and 130b or heatsinks mounted on processors 130a and 130b. FIG. 4C also shows plenum outlets 136d, 136e, 136f, and 136g which are aligned with and discharge air over memory units 132a, 132b, 132c, and 132d, respectively. FIG. 4D shows plenum outlet 136c which is aligned with and discharges air over power supply 124.

During operation of server 100, blowers 126a, 126b, 126c, and 126d draw air through an intake grille (not shown) on front side 102 of server 100. Since bulkhead 127 provides a substantially airtight wall between blowers 126 and PCI card 120, motherboard 122, and power supply 124, blowers 126a, 126b, 126c, and 126d do not draw air from rear side 104 of server 100. The air drawn from front side 102 travels above and beneath disk drives 128a, 128b, 128c, and 128d cooling the hard drives and then past backplane 129 into respective inlets in blowers 126a, 126b, 126c, and 126d.

Blower 126a accelerates the air it has drawn and expels the air through an outlet and a corresponding opening in bulkhead 127. The air flows over PCI card 120 cooling the electrical components mounted thereon and also forces air that is expelled from outlets 136a and 136b out of rear side 104 of server 100. The air then exits rear side 104 of server 100.

Blowers 126b, 126c, and 126d accelerate air they have drawn and expel the air through outlets and corresponding holes in bulkhead into a front portion 134a of plenum 134. All or a portion of the air discharged by blowers 126b, 126c or 126d is then channeled or guided by plenum 134 from front portion 134a of plenum 134 to rear portion 134b of plenum 134. A portion of air channeled or guided to rear portion 134b then exits plenum 134 at a relatively high velocity through outlets 136a and 136b thereby cooling processors 130a and 130b. A portion of air channeled or guided to rear portion 134b also exits plenum 134 through outlets 136d, 136e, 136f, and 136g thereby cooling memory units 132a, 132b, 132c, and 132d. All or a portion of the air discharged by blowers 126b, 126c or 126d also exits plenum 134 through outlet 136c. This portion of air travels under or over power supply 124 thereby cooling power supply 124 and then exits rear side 104 of server 100.

Figure 5:
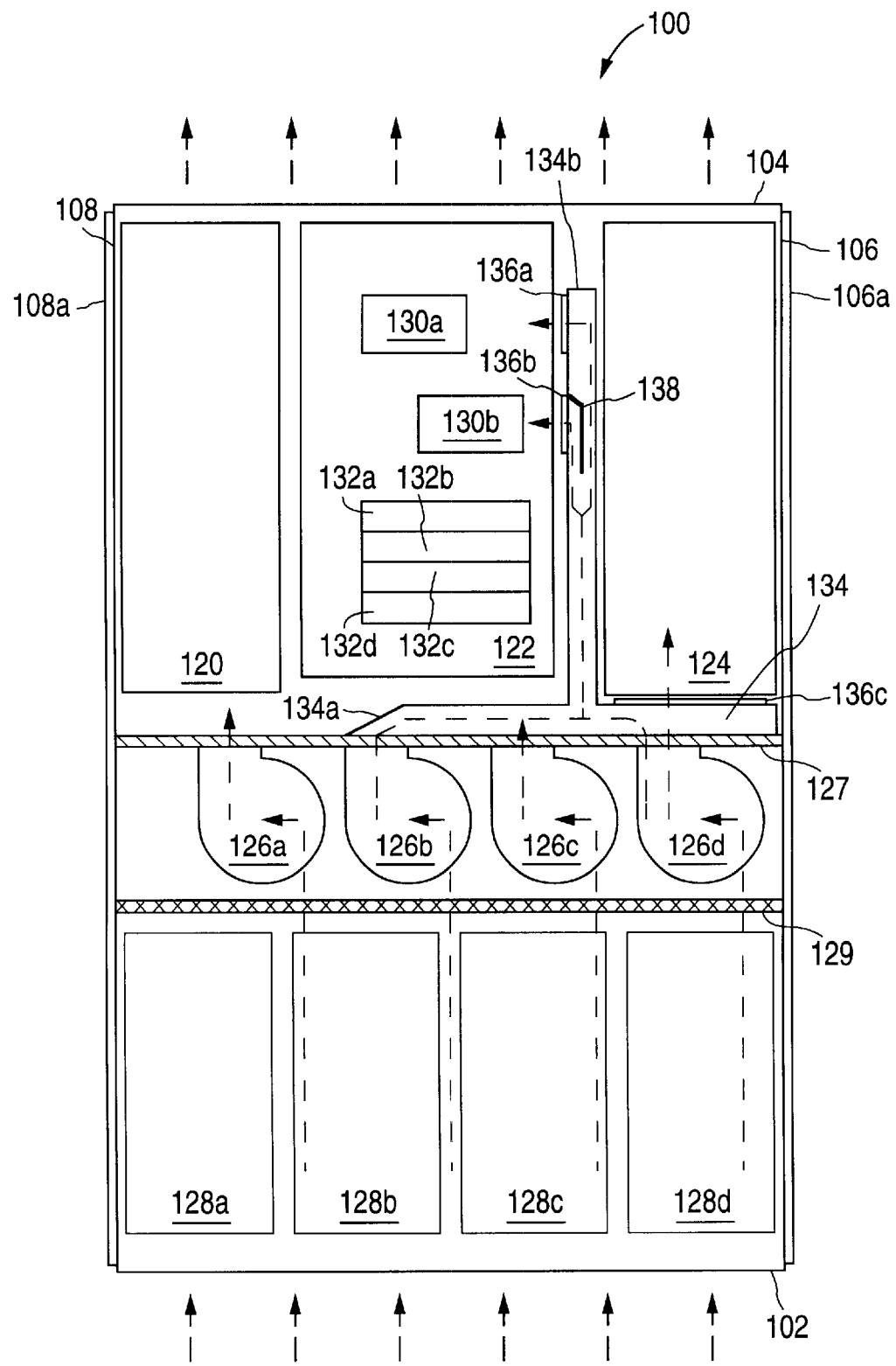
FIG. 5 is a top view of a server having a plenum with an air deflector with its cover removed, according to some embodiments of the present invention.

FIG. 5 is a top view of an exemplary server 100 with its cover sections 110a, 110b, and 110c removed, according to some embodiments of the present invention. Server 100 of FIG. 5 is similar to server 100 of FIG. 4 except that plenum 134 includes an air deflector 138. Air deflector 138 can be positioned within plenum 134 to control the amount of air that is expelled from outlets 136a and 136b. For example, air deflector 138 can be positioned within plenum 134 so that substantially equal amounts of air are expelled from outlets 136a and 136b.

Figure 6:
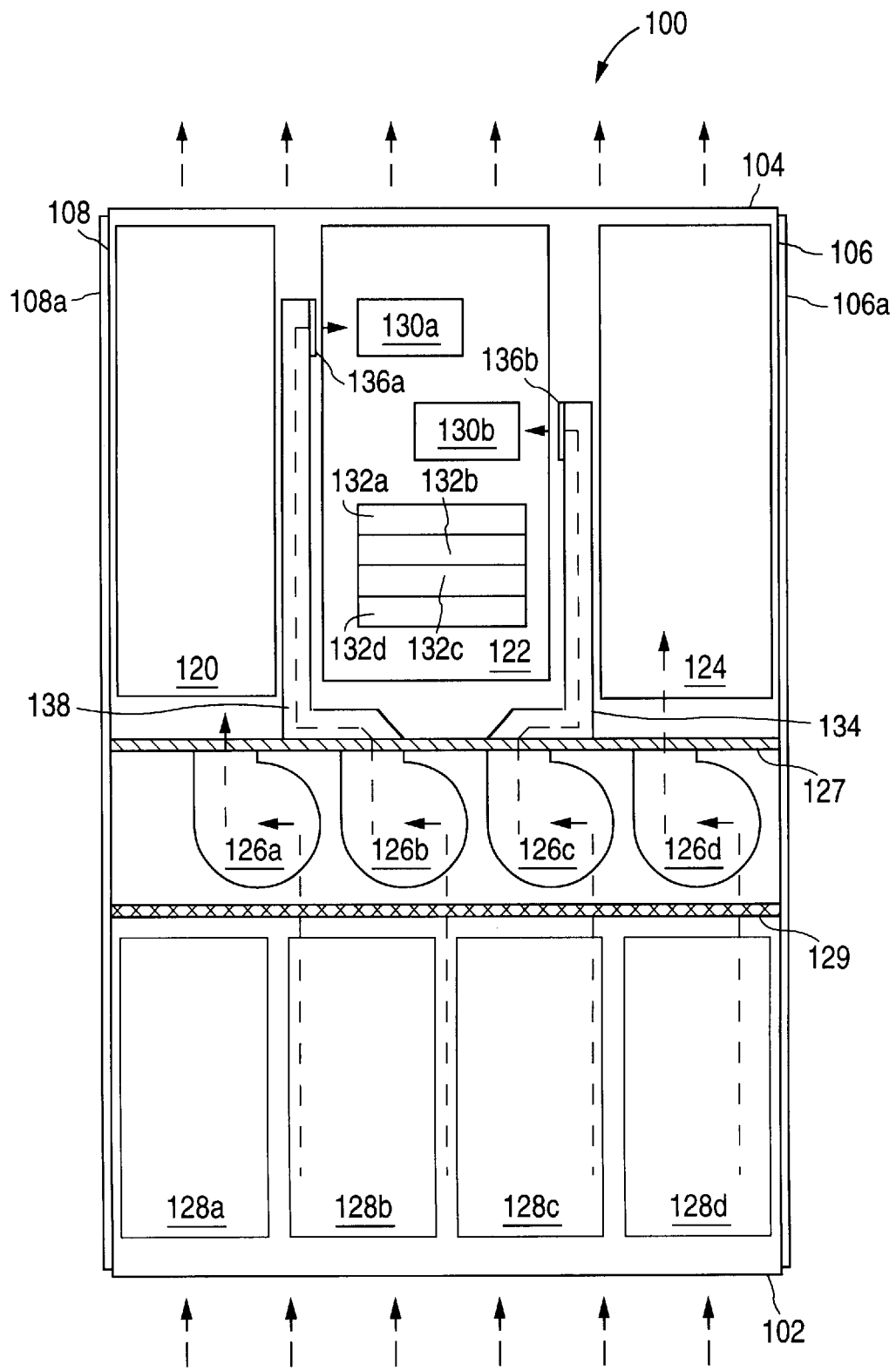
FIG. 6 is a top view of a server having two plenums with its cover removed, according to some embodiments of the present invention.

FIG. 6 is a top view of an exemplary server 100 with cover sections 110a, 110b, and 110c removed, according to some embodiments of the present invention. Server 100 of FIG. 6 is similar to servers 100 of FIGS. 4 and 5 except that two plenums—plenum 134 and plenum 138—are used. The air discharged by blower 126b is channeled or guided by plenum 138 to outlet 136a where it is expelled, thereby cooling processor 130a. Similarly, the air discharged by blower 126c is channeled or guided by plenum 134 to outlet 136b where it is expelled, thereby cooling processor 130b.

One advantage of the present invention is that plenum 134 can transfer air to a location proximate to processors 130a and 130b. The air is then ducted directly across processors 136a and 136b or, if processors 136a and 136b have passive heatsinks mounted thereon, directly across the passive heatsinks. Since the air exits each outlet of plenum 134 at a high velocity (e.g., approximately 200–300 linear feet per minute per outlet), a high convection coefficient is achieved across processors 136a and 136b or the passive heatsinks mounted on processors 136a and 136b. This convection coefficient is much higher than that which could be achieved using a conventional cooling system. Thus, high power processors, which would overheat in a low profile server using a conventional cooling system, can now be implemented in a low profile server.

Another advantage of the present invention is that it is no longer necessary to design and manufacture custom motherboards that place the location of processors closer to air movement devices so as to achieve a higher convection coefficient. The design and manufacturing of such custom motherboards are expensive and time consuming. Using the present invention, high power processors can be installed in standard motherboards, such as motherboards that conform to the ATX or EATX standard. The plenum of the present invention transfers air from one or more air movement devices to a location proximate to the processors so that an adequate convection coefficient can be achieved.

While particular embodiments have been shown and described, it will be obvious to those skilled in the art that various changes and modifications may be made without departing from this invention in its broader aspects and therefore the appended claims encompass all such changes and modifications as fall within the true spirit and scope of this invention. For example, it should be recognized that covers 110 and 110' shown in FIGS. 2A through 2D are merely examples and that other types of multi-sectional covers can be used in accordance with the present invention. It should also be recognized that the plenums shown in FIGS. 4, 5, and 6 are merely examples of plenums that can be used in server 100 and that other plenums, such as plenums having other shapes and different numbers of inlets and outlets, can be used in accordance with the present invention. It should also be recognized that air deflector 138 of FIG. 5 is just one example of an air deflector that can be used in plenum 134 and that other air deflectors can be disposed within plenum 134 to control the flow of air to the outlets or otherwise control the flow of air in plenum 134 as needed.

What is claimed is:

1. A computer system comprising:
   a chassis;
   a processor disposed in the chassis wherein the processor has a passive heatsink mounted thereon;
   an air movement device disposed in the chassis, the air movement device having an inlet for receiving air and an outlet for expelling air; and
   a plenum disposed in the chassis, the plenum having an inlet for receiving air from the outlet of the air movement device and an outlet for expelling the air proximate to the processor.

2. The computer system of claim 1 wherein the chassis is a low profile chassis.

3. The computer system of claim 1 wherein the chassis is approximately 1.75" in height.

4. The computer system of claim 1 wherein the air movement device is a centrifugal blower.

5. A computer system comprising:
   a chassis;
   a processor disposed in the chassis;
   an air movement device disposed in the chassis, the air movement device having an inlet for receiving air and an outlet for expelling air; and
   a plenum disposed in the chassis, the plenum having an inlet for receiving air from the outlet of the air movement device and an outlet for expelling the air proximate to the processor
   wherein the chassis includes a first processor and a second processor and the plenum includes a first outlet for expelling air proximate to the first processor and a second outlet for expelling air proximate to the second processor.

6. A computer system comprising:
   a chassis;
   a processor disposed in the chassis;
   an air movement device disposed in the chassis, the air movement device having an inlet for receiving air and an outlet for expelling air; and
   a plenum disposed in the chassis, the plenum having an inlet for receiving air from the outlet of the air movement device and an outlet for expelling the air proximate to the processor
   wherein the air movement device is located in a center region of the chassis and the plenum extends from the air movement device along the side of a motherboard to which the processor is mounted to a location proximate to the processor.

7. A computer system comprising:
   a chassis;
   a processor disposed in the chassis wherein the processor has a passive heatsink mounted thereon;
   air movement means disposed in the chassis for drawing air into the chassis and expelling air; and
   air channeling means disposed in the chassis for channeling the expelled from the air movement means to a location proximate to the processor and directing the air over the processor.

8. The computer system of claim 7 wherein the chassis is a low profile chassis.

9. The computer system of claim 7 wherein the chassis is approximately 1.75" in height.

10. The computer system of claim 7 wherein the air movement means is a centrifugal blower.

11. A computer system comprising:
    a chassis;
    a processor disposed in the chassis;
    air movement means disposed in the chassis for drawing air into the chassis and expelling air; and
    air channeling means disposed in the chassis for channeling the expelled from the air movement means to a location proximate to the processor and directing the air over the processor
    wherein the chassis includes a first processor and a second processor and the air channeling means includes a first outlet for directing air over the first processor and a second outlet for directing air over the second processor.

12. A computer system comprising:
    a chassis;
    a processor disposed in the chassis;
    air movement means disposed in the chassis for drawing air into the chassis and expelling air; and
    air channeling means disposed in the chassis for channeling the expelled from the air movement means to allocation proximate to the processor and directing the air over the processor
    wherein the air movement means is located in a center region of the chassis and the air channeling means extends from the air movement means along the side of a motherboard to which the processor is mounted to a location proximate to the processor.

13. A method for cooling a processor disposed in a chassis, the method comprising:
    drawing air through an inlet of the chassis into an air movement device wherein the processor has a passive heatsink mounted thereon;
    expelling the air from the air movement device into a plenum;
    redirecting the air to a location proximate to the processor via the plenum; and
    discharging the air from an outlet of the plenum over the processor.

14. The method of claim 13 wherein the chassis is a low profile chassis.

15. The method of claim 13 wherein the chassis is approximately 1.75" in height.

16. The method of claim 13 wherein the air movement device is a centrifugal blower.

17. A method for cooling a processor disposed in a chassis, the method comprising:
    drawing air through an inlet of the chassis into an air movement device;

expelling the air from the air movement device into a plenum;

redirecting the air to a location proximate to the processor via the plenum; and discharging the air from an outlet of the plenum over the processor wherein the chassis includes a first processor and a second processor and the step of redirecting the air to a location proximate to the processor includes redirecting a portion of the air expelled from the air movement device to a location proximate to the first processor and redirecting a portion of the air expelled from the air movement device to a location proximate to the second processor.

18. A method for cooling a processor disposed in a chassis, the method comprising:

drawing air through an inlet of the chassis into an air movement device;

expelling the air from the air movement device into a plenum;

redirecting the air to a location proximate to the processor via the plenum; and discharging the air from an outlet of the plenum over the processor wherein the air movement device is located in a center region of the chassis and the plenum extends from the air movement device along the side of a motherboard to which the processor is mounted to a location proximate to the processor.

19. A computer system comprising:

a chassis;

slides disposed on a first side and a second side of the chassis, the slides for mounting the chassis in a computer rack; and a cover having at least two removable sections, wherein the chassis can be partially removed from the computer rack by partially sliding the chassis out of the front and/or rear of the rack thereby allowing an operator to access computer components located beneath one of the removable sections.

20. The computer system of claim 19 wherein the chassis is a low profile chassis.

21. The computer system of claim 22 wherein the chassis is approximately 1.75" in height.

22. The computer system of claim 19 wherein the cover includes a front section, a mid-section, and a rear section and the mid-section can be accessed and removed by partially sliding the chassis out of the front and/or rear of the rack thereby allowing an operator to access computer components located beneath the mid-section without having to remove the front section or the rear section.

23. The computer system of claim 19 wherein the chassis is connected to a computer network and the chassis can be partially removed from the computer rack by partially sliding the chassis out of the rack thereby allowing an operator to access computer components located beneath one of the sections without having to disconnect the chassis from the network.

24. A computer system comprising:

a chassis;

mounting means disposed on a first side and a second side of the chassis, the mounting means for mounting the chassis in a computer rack; and cover means disposed over a top portion of the chassis having at least two removable sections, wherein the cover means allows an operator to partially remove the chassis from the front and/or rear of the computer rack, remove a section of the cover means, and access one or more computer components located below the removed section of the cover means.

25. The computer system of claim 24 wherein the chassis is a low profile chassis.

26. The computer system of claim 24 wherein the chassis is approximately 1.75" in height.

27. The computer system of claim 24 wherein the cover means includes a front section, a middle section, and a rear section, and the middle section can be accessed and removed by partially sliding the chassis out of the rack thereby allowing an operator to access computer components located beneath the middle section without having to remove the front section or the rear section.

28. The computer system of claim 24 wherein the chassis is connected to a computer network and the chassis can be partially removed from the computer rack by partially sliding the chassis out of the rack thereby allowing an operator to access computer components located beneath one of the sections without having to disconnect the chassis from the network.

29. A computer enclosure comprising:

a chassis;

a first processor disposed in the chassis wherein the processor has a passive heatsink mounted thereon;

an air movement device disposed in the chassis, the air movement device having an inlet for receiving air and an outlet for expelling air; and a plenum disposed in the chassis, the plenum having an inlet for receiving air from the outlet of the air movement device and an outlet for expelling the air proximate to the first processor.

30. The computer enclosure of claim 29 wherein the chassis is a low profile chassis.

31. The computer enclosure of claim 29 wherein the chassis is approximately 1.75" in height.

32. The computer enclosure of claim 29 wherein the air movement device is a centrifugal blower.

33. A computer enclosure comprising:

a chassis;

a first processor disposed in the chassis;

an air movement device disposed in the chassis, the air movement device having an inlet for receiving air and an outlet for expelling air; and a plenum disposed in the chassis, the plenum having an inlet for receiving air from the outlet of the air movement device and an outlet for expelling the air proximate to the first processor wherein the chassis includes a second processor and the plenum includes a first outlet for expelling air proximate to the first processor and a second outlet for expelling air proximate to the second processor.

34. A computer enclosure comprising:

a chassis;

a first processor disposed in the chassis;

an air movement device disposed in the chassis, the air movement device having an inlet for receiving air and an outlet for expelling air; and a plenum disposed in the chassis, the plenum having an inlet for receiving air from the outlet of the air movement device and an outlet for expelling the air proximate to the first processor wherein the air movement device is located in a center region of the chassis and the plenum extends from the air movement device along the side of a motherboard to which the processor is mounted to a location proximate to the processor.

35. A computer enclosure comprising:

a chassis;

slides disposed on a first side and a second side of the chassis, the slides for mounting the chassis in a computer rack; and a cover having at least two removable sections, wherein the chassis can be partially removed from the computer rack by partially sliding the chassis out of the front and the rear of the rack thereby allowing an operator to access computer components located beneath one of the removable sections.

36. The computer enclosure of claim 35 wherein the chassis is a low profile chassis.

37. The computer enclosure of claim 35 wherein the chassis is approximately 1.75" in height.

38. The computer enclosure of claim 35 wherein the cover includes a front section, a mid-section, and a rear section and the mid-section can be accessed and removed by partially sliding the chassis out of the front and the rear of the rack thereby allowing an operator to access computer components located beneath the mid-section without having to remove the front section or the rear section.

39. The computer enclosure of claim 35 wherein the chassis is connected to a computer network and the chassis can be partially removed from the computer rack by partially sliding the chassis out of the rack thereby allowing an operator to access computer components located beneath one of the sections without having to disconnect the chassis from the network.

* * * * *